(12) United States Patent
Qoutb et al.

(10) Patent No.: US 11,594,357 B2
(45) Date of Patent: Feb. 28, 2023

(54) SWITCHING OF PERPENDICULARLY MAGNETIZED NANOMAGNETS WITH SPIN-ORBIT TORQUES IN THE ABSENCE OF EXTERNAL MAGNETIC FIELDS

(71) Applicant: University of Rochester, Rochester, NY (US)

(72) Inventors: Abdelrahman G. Qoutb, Rochester, NY (US); Eby G. Friedman, Rochester, NY (US)

(73) Assignee: University of Rochester, Rochester, NY (US)

( * ) Notice: Subject to any disclaimer, the term of this patent is extended or adjusted under 35 U.S.C. 154(b) by 208 days.

(21) Appl. No.: 16/850,173

(22) Filed: Apr. 16, 2020

(65) Prior Publication Data
US 2020/0286659 A1    Sep. 10, 2020

Related U.S. Application Data

(63) Continuation-in-part of application No. 16/710,531, filed on Dec. 11, 2019, now Pat. No. 11,004,588, (Continued)

(51) Int. Cl.
*H01F 10/32* (2006.01)
*G11C 11/16* (2006.01)
(Continued)

(52) U.S. Cl.
CPC ........ *H01F 10/3286* (2013.01); *G11C 11/161* (2013.01); *G11C 11/1675* (2013.01);
(Continued)

(58) Field of Classification Search
CPC ... G11C 11/1675; G11C 11/161; G11C 11/18; H01F 10/329; H01F 10/3285; H03K 19/18; H01L 43/10; H01L 43/065; H01L 43/00
See application file for complete search history.

(56) References Cited

U.S. PATENT DOCUMENTS 8,659,938 B2   2/2014  Prejbeanu
9,171,601 B2 * 10/2015  Shukh ............... H01L 43/02
(Continued)

FOREIGN PATENT DOCUMENTS

WO   WO-2009136454 A1   11/2009
WO   WO-2014089182 A1    6/2014
WO   WO-2015116416 A1    8/2015

OTHER PUBLICATIONS

ISA/European Patent Office, International Search Report and Written Opinion for Corresponding International Application No. PCT/US2016/028045, dated Jan. 20, 2017 (10 pgs).

*Primary Examiner* — Vanthu T Nguyen
(74) *Attorney, Agent, or Firm* — Harris Beach PLLC (57) ABSTRACT

A base element for switching a magnetization state of a nanomagnet includes a heavy-metal nanostrip having a surface. The heavy-metal nanostrip includes at least a first layer including a heavy metal and a second layer which includes a different heavy-metal. A ferromagnetic nanomagnet is disposed adjacent to the surface. The ferromagnetic nanomagnet includes a shape having a long axis and a short axis, the ferromagnetic nanomagnet having both a perpendicular-to-the-plane anisotropy $H_{kz}$ and an in-plane anisotropy $H_{kx}$ and the ferromagnetic nanomagnet having a first magnetization equilibrium state and a second magnetization equilibrium state. The first magnetization equilibrium state or the second magnetization equilibrium state is settable by a flow of electrical charge through the heavy-metal nanostrip. A direction of the flow of electrical charge through the heavy-metal nanostrip includes an angle ξ with respect to the short axis of the nanomagnet.

15 Claims, 6 Drawing Sheets

Related U.S. Application Data which is a continuation of application No. 15/572,017, filed as application No. PCT/US2016/028045 on Apr. 18, 2016, now Pat. No. 10,510,474.

(60) Provisional application No. 62/158,805, filed on May 8, 2015.

(51) Int. Cl.
    *H03K 19/18*     (2006.01)
    *H01L 43/10*     (2006.01)
    *H01L 43/00*     (2006.01)
    *G11C 11/18*     (2006.01)
    *H01L 43/06*     (2006.01)
    *H01L 43/04*     (2006.01)

(52) U.S. Cl.
    CPC ............ *G11C 11/18* (2013.01); *H01F 10/329* (2013.01); *H01L 43/00* (2013.01); *H01L 43/04* (2013.01); *H01L 43/06* (2013.01); *H01L 43/065* (2013.01); *H01L 43/10* (2013.01); *H03K 19/18* (2013.01); *Y10S 148/109* (2013.01)

(56) References Cited

U.S. PATENT DOCUMENTS

| | | | |
|---|---|---|---|
| 9,230,626 | B2 | 1/2016 | Buhrman et al. |
| 9,300,301 | B2 | 3/2016 | Bromberg et al. |
| 2007/0077664 | A1* | 4/2007 | Chung ................. H01L 27/228 438/2 |
| 2011/0234216 | A1 | 9/2011 | Nakamura et al. |
| 2014/0056060 | A1* | 2/2014 | Khvalkovskiy ......... H01L 43/02 365/158 |
| 2014/0169088 | A1 | 6/2014 | Buhrman et al. |
| 2015/0097159 | A1 | 4/2015 | Apalkov et al. |

* cited by examiner

SWITCHING OF PERPENDICULARLY MAGNETIZED NANOMAGNETS WITH SPIN-ORBIT TORQUES IN THE ABSENCE OF EXTERNAL MAGNETIC FIELDS

CROSS-REFERENCE TO RELATED APPLICATIONS

This application is a continuation-in-part (CIP) of co-pending U.S. patent application Ser. No. 16/710,531, and claims priority to U.S. patent application Ser. No. 16/710,531, SWITCHING OF PERPENDICULARLY MAGNETIZED NANOMAGNETS WITH SPIN-ORBIT TORQUES IN THE ABSENCE OF EXTERNAL MAGNETIC FIELDS, filed Dec. 11, 2019, U.S. patent application Ser. No. 15/572,017, SWITCHING OF PERPENDICULARLY MAGNETIZED NANOMAGNETS WITH SPIN-ORBIT TORQUES IN THE ABSENCE OF EXTERNAL MAGNETIC FIELDS, filed Nov. 6, 2017, now U.S. Pat. No. 10,510,474 to Kazemi, et al., issued Dec. 17, 2019, PCT Application No. PCT/US16/28045, filed Apr. 18, 2016, SWITCHING OF PERPENDICULARLY MAGNETIZED NANOMAGNETS WITH SPIN-ORBIT TORQUES IN THE ABSENCE OF EXTERNAL MAGNETIC FIELDS, published as WO2016190984 A2, which claims priority to and the benefit of U.S. provisional patent application Ser. No. 62/158,805, SWITCHING OF PERPENDICULARLY MAGNETIZED NANOMAGNETS WITH SPIN-ORBIT TORQUES IN THE ABSENCE OF EXTERNAL MAGNETIC FIELDS, filed May 8, 2015, which applications are incorporated herein by reference in their entirety.

STATEMENT REGARDING FEDERALLY FUNDED RESEARCH OR DEVELOPMENT

This invention was made with government support under CCF-1716091 awarded by the National Science Foundation. The government has certain rights in the invention.

FIELD OF THE APPLICATION

The application relates to switching the magnetization of nanomagnets and particularly to a base element structure and method for switching the magnetization of nanomagnets.

BACKGROUND

Complementary metal-oxide-semiconductor (CMOS) technologies are prevalent today in memory and logic systems. However, CMOS technologies no longer provide a desired balance of fast operation, high density integration, and energy efficiency.

SUMMARY

A base element for switching a magnetization state of a nanomagnet includes a heavy-metal nanostrip having a surface. The heavy-metal nanostrip includes at least a first layer including a heavy metal and a second layer which includes a different heavy-metal. A ferromagnetic nanomagnet is disposed adjacent to the surface. The ferromagnetic nanomagnet includes a shape having a long axis and a short axis, the ferromagnetic nanomagnet having both a perpendicular-to-the-plane anisotropy $H_{kz}$ and an in-plane anisotropy $H_{kx}$ and the ferromagnetic nanomagnet having a first magnetization equilibrium state and a second magnetization equilibrium state. The first magnetization equilibrium state or the second magnetization equilibrium state is settable by a flow of electrical charge through the heavy-metal nanostrip. A direction of the flow of electrical charge through the heavy-metal nanostrip includes an angle ξ with respect to the short axis of the nanomagnet.

The heavy-metal nanostrip can include a trilayer.

The heavy-metal nanostrip can include a Hafnium (Hf) or a Tungsten (W) in β-phase.

The heavy-metal nanostrip can include at least one of a Cu/Pb alloy, a Cu/Pt alloy, and a Cu/Au alloy.

The heavy-metal nanostrip can include a bilayer.

The bilayer can include at least one of Pt/Ta, Pt/W, Pt/Hf, and W/Hf.

The bilayer can include at least one of Au/W, Pt/Hf, Pt/Al, and Au/Ta.

The nanomagnet can include a Co alloy.

The nanomagnet can include at least one of Ruthenium (Ru), Ta, Co, Pt, Ni, TaN, $NiFeO_x$, NiFeB, CoFeB, CoFe, $CoFeO_xB$, $NiOxB$, $CoBO_x$, $FeBO_x$, CoFeNiB, CoPt, CoPd, CoNi, $TaO_x$, FeCoB, mixtures thereof, combinations thereof, and alloys thereof.

The nanomagnet can include a multilayer structure.

A base element for switching a magnetization state of a nanomagnet includes a heavy-metal nanostrip having a surface. A ferromagnetic nanomagnet is disposed adjacent to the surface. The ferromagnetic nanomagnet includes a shape having a long axis and a short axis. The ferromagnetic nanomagnet has both a perpendicular-to-the-plane anisotropy $H_{kz}$ and an in-plane anisotropy $H_{kx}$ and the ferromagnetic nanomagnet has a first magnetization equilibrium state and a second magnetization equilibrium state. The first magnetization equilibrium state or the second magnetization equilibrium state is settable by a flow of electrical charge through the heavy-metal nanostrip. A Hf layer is disposed between the heavy-metal nanostrip and the ferromagnetic nanomagnet. A direction of flow of the flow of electrical charge through the heavy-metal nanostrip includes an angle ξ with respect to the short axis of the nanomagnet.

A base element of a sensor device for switching a magnetization state of a nanomagnet includes a heavy-metal strip having a surface. A ferromagnetic nanomagnet disposed adjacent to the surface. The ferromagnetic nanomagnet includes a shape having a long axis and a short axis, the ferromagnetic nanomagnet having both a perpendicular-to-the-plane anisotropy $H_{kz}$ and an in-plane anisotropy $H_{kx}$ and the ferromagnetic nanomagnet having a first magnetization equilibrium state and a second magnetization equilibrium state. The first magnetization equilibrium state or the second magnetization equilibrium state is settable in an absence of an external magnetic field by a flow of electrical charge through the heavy-metal strip. A direction of flow of the flow of electrical charge through the heavy-metal strip includes an angle ξ with respect to the short axis of the nanomagnet. The base element provides a sensing element of the sensor device.

The sensor device can include a temperature sensor.

The sensor device can include a pressure sensor.

The sensor device can include a magnetic field sensor.

The foregoing and other aspects, features, and advantages of the application will become more apparent from the following description and from the claims.

BRIEF DESCRIPTION OF THE DRAWINGS

The features of the application can be better understood with reference to the drawings described below, and the claims. The drawings are not necessarily to scale, emphasis instead generally being placed upon illustrating the principles described herein. In the drawings, like numerals are used to indicate like parts throughout the various views.

DETAILED DESCRIPTION

Magnetization switching of ferromagnets using spin-orbit torques provides opportunities to introduce nanomagnets into high performance logic and memory applications requiring low power consumption. Nanomagnets with perpendicular-to-the-plane anisotropy have recently attracted a considerable attention due to their high thermal stability. High stability against thermal fluctuations allows nanomagnets to be deeply scaled down, resulting in dense logic and memory systems with ultra-low power consumption. However, due to the symmetric energy landscape experienced by the magnetization of a nanomagnet with perpendicular-to-the-plane anisotropy, spin-orbit torques induced by an in-plane current pulse cannot switch the magnetization. An external magnetic field is, therefore, required to assist spin-orbit torques by breaking the symmetry. Although the energy dissipated by switching a nanomagnet could be small, the energy necessary to generate the required magnetic field makes the overall memory or logic scheme uncompetitive as compared to complementary metal-oxide-semiconductor (CMOS) counterparts. Additional metals are also necessary to produce the required magnetic field, significantly decrease the number of devices which can be integrated over a given area. Therefore, the need for an external magnetic field is an obstacle for developing dense low power memory and logic systems. Furthermore, fast switching requires higher energy to be injected through the ferromagnet and/or metals producing magnetic field. Since the required energy grows significantly as the desired switching speed increases, fast operation compromises the energy efficiency.

A solution to the problems described hereinabove switches the magnetization of a nanomagnet with perpendicular-to-the-plane anisotropy using spin-orbit torques induced by an in-plane current pulse without the presence of an external magnetic field.

The solution includes a scheme to switch the magnetization of a nanomagnet with perpendicular-to-the-plane anisotropy using spin-orbit torques induced by an in-plane current pulse without the presence of an external magnetic field. It was realized that magnetization switching can be achieved by breaking the symmetry by introducing an in-plane anisotropy into the nanomagnet. We describe how spin orbit torques induced by an in-plane current pulse of appropriate amplitude and duration are sufficient to switch the magnetization of the nanomagnet in absence of an external magnetic field. For a given ratio between the in-plane and perpendicular-to-the-plane anisotropies, high switching probability (deterministic switching) is achievable for current pulses of significantly short duration by balancing the spin-orbit and damping torques, resulting in ultra-fast switching. Furthermore, since external magnetic field is not required for magnetization switching within the described scheme, energy efficiency and integration density is significantly improved, resulting in ultra-fast dense memory and low power consumption logic systems.

Figure 1:
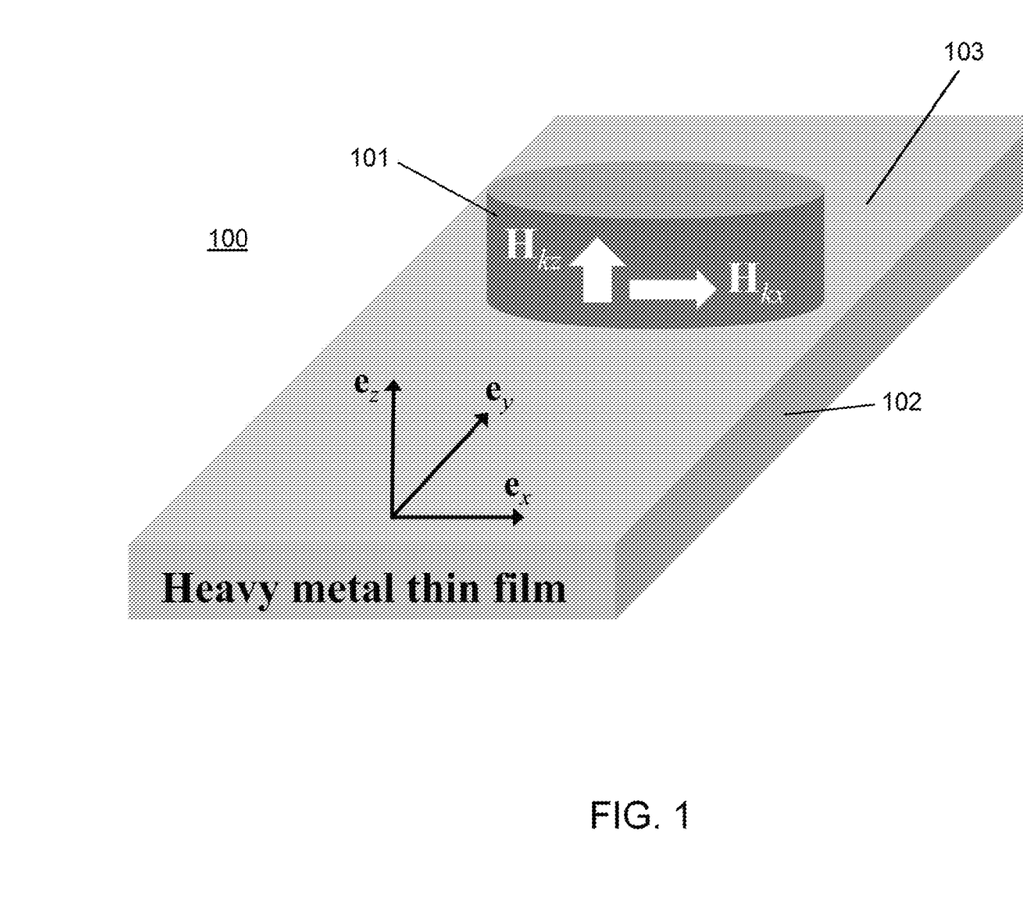
FIG. 1 is a drawing showing a ferromagnetic layer adjacent to a heavy-metal nonmagnetic nanostrip.

FIG. 1 shows an exemplary ferromagnetic layer including a perpendicular-to-the-plane anisotropy ($H_{kz}$) and an in-plane anisotropy ($H_{kx}$) is situated on a heavy-metal nanostrip. In one exemplary embodiment, the proposed structure of base element 100, FIG. 1 shows a ferromagnetic layer represented by a Stoner-Wohlfarth monodomain magnetic body 101 with magnetization M, situated at a heavy-metal nonmagnetic nanostrip 102 with strong spin-orbit coupling. The ferromagnetic layer, as shown in FIG. 1, includes a perpendicular-to-the-plane uniaxial anisotropy $H_{kz}$ along the $e_z$ axis and an in-plane uniaxial anisotropy $H_{kx}$ along the $e_x$ axis.

Figure 2:
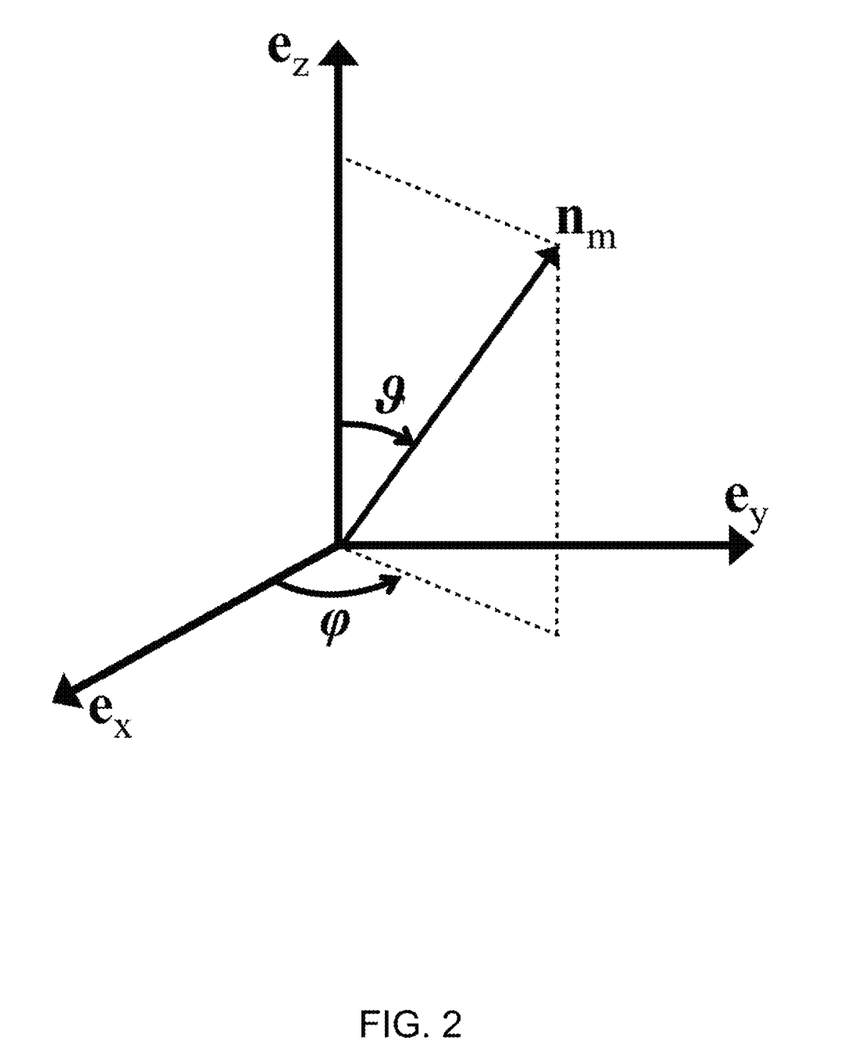
FIG. 2 is a drawing showing how the dynamics of the magnetization motion can be captured by $\vartheta$ and $\varphi$.

FIG. 2 shows how the dynamics of the magnetization motion can be captured by $\vartheta$ and $\varphi$. As shown in FIG. 2, the motion of M is represented by a unit vector $n_m$, which makes an angle $\vartheta$ with $e_z$ axis, while the plane of M and $e_z$ makes an angle $\varphi$ with $e_x$.

Figure 3A:
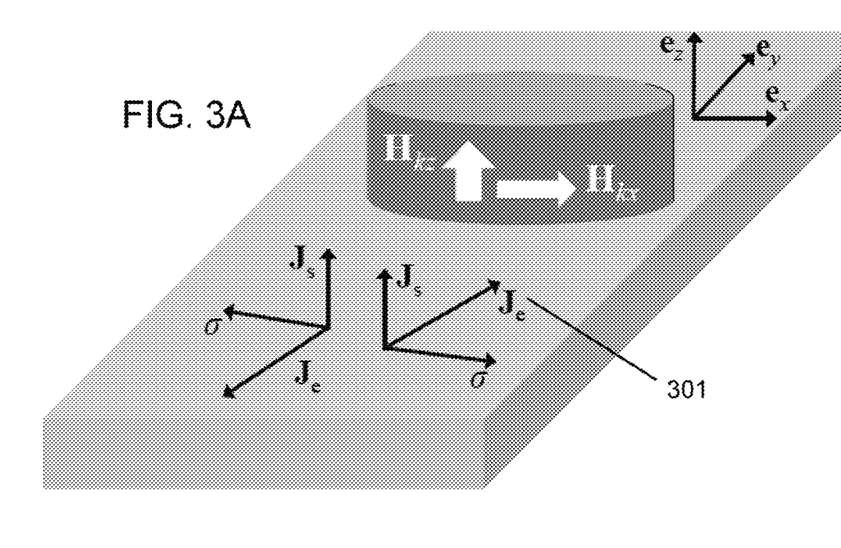
FIG. 3A is a drawing showing that the charge current ($J_e$) injected through the nonmagnetic heavy-metal induces spin current ($J_s$)

FIG. 3A shows that the charge current ($J_e$) injected through the nonmagnetic heavy-metal induces spin current ($J_s$). As shown in FIG. 3A, a charge current $J_e$, injected through the heavy-metal nanostrip, produces a traverse spin current $J_s = \theta_{SH}(\sigma \times J_e)$ due to the spin-orbit interaction, where $J_e$ is the charge current density, $\sigma$ is the spin polarization unit vector, and $\theta_{SH}$ is the material dependent spin Hall angle.

Figure 3B:
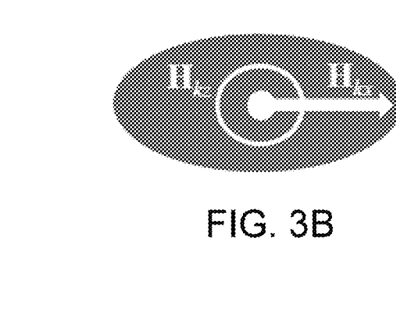
FIG. 3B is a drawing showing an exemplary elliptical ferromagnet having an in-plane anisotropy $H_{kx}$.

FIG. 3B shows an illustration of an exemplary elliptical ferromagnet having an in-plane anisotropy $H_{kx}$.

Figure 3C:
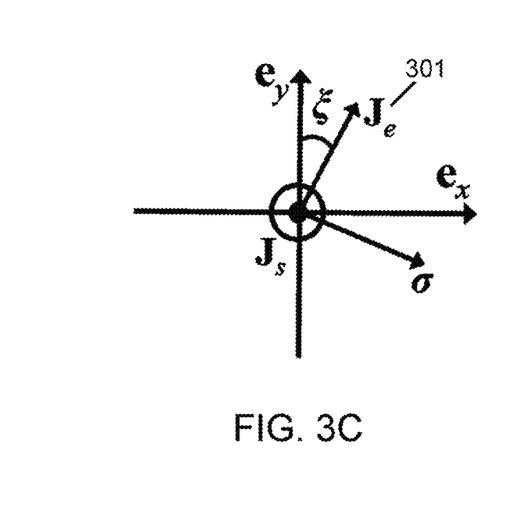
FIG. 3C is a drawing that shows the charge current direction and orientation of the spin polarization $\sigma$ with respect to $H_{kx}$.

FIG. 3C shows the charge current direction 301 and orientation of the spin polarization $\sigma$ with respect to the $H_{kx}$. As shown in FIG. 3C, the direction of the charge current $J_e$ makes an angle of $\xi$ with $e_y$ axis. Spin polarized current transports spin angular momentum into the nanomagnet, exerting a torque on the magnetization. The dynamics of M under the influence of torques and anisotropy fields is described using the Landau-Lifshitz-Gilbert (LLG) equation as $$\frac{dn_m}{dt} = -\gamma(n_m \times H_{eff}) + \alpha\left(n_m \times \frac{dn_m}{dt}\right) + \gamma T_{ST}, \qquad (1)$$

where $\gamma$ is the gyromagnetic ratio, $\alpha$ is the damping factor, $T_{ST}$ is the spin torque, and $H_{eff}$ is the effective field experienced by the magnetization of the ferromagnetic layer. $H_{eff}$ is a function of $H_{kx}$ and $H_{kz}$. The spin torque has two components, referred to as the in-plane and out-of-plane torques: $T_{ST} = T_{IP} + T_{OOP}$.

Figure 4:
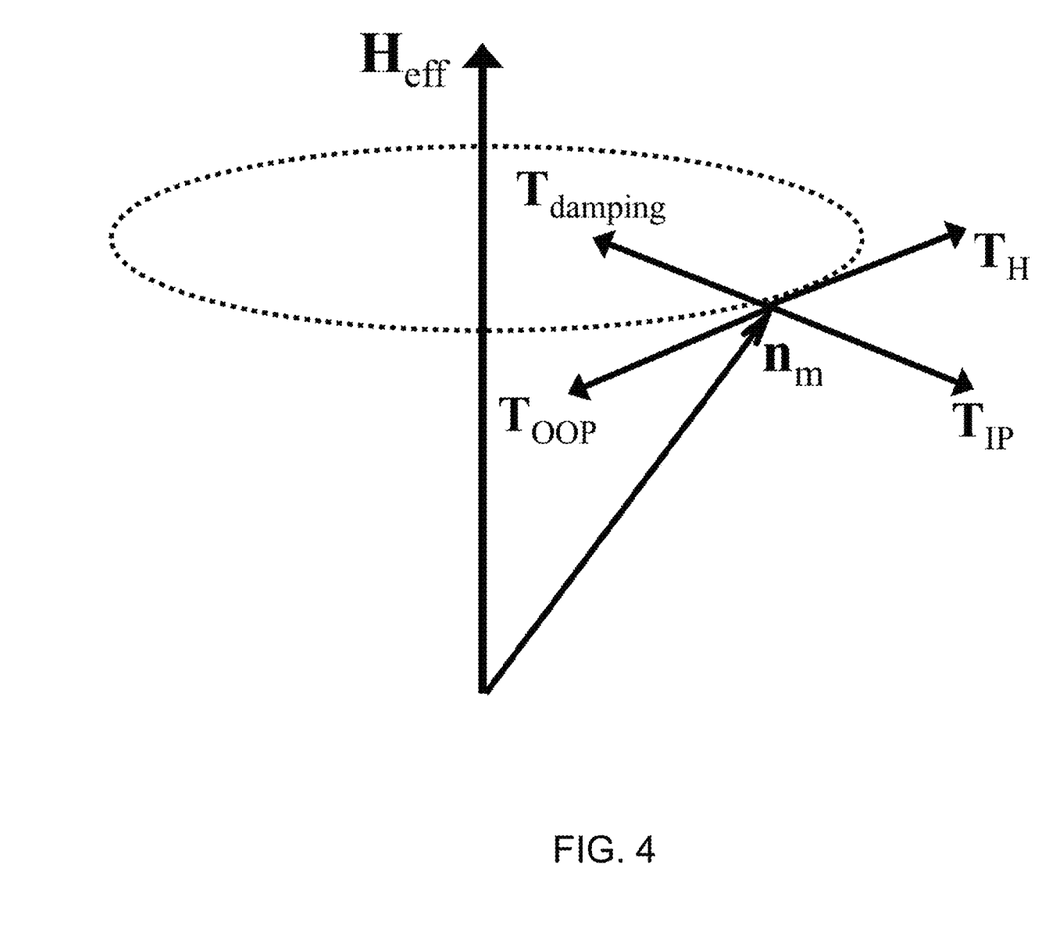
FIG. 4 is a drawing showing the motion of magnetization under the influence of spin-torques and anisotropies.

FIG. 4 shows the motion of magnetization under the influence of spin-torques and anisotropies. As demonstrated in FIG. 4, the in-plane torque $T_{IP}$ lies in the plane defined by M and $H_{eff}$, and the out-of-plane torque $T_{OOP}$ points out of the plane defined by M and $H_{eff}$.

Figure 5:
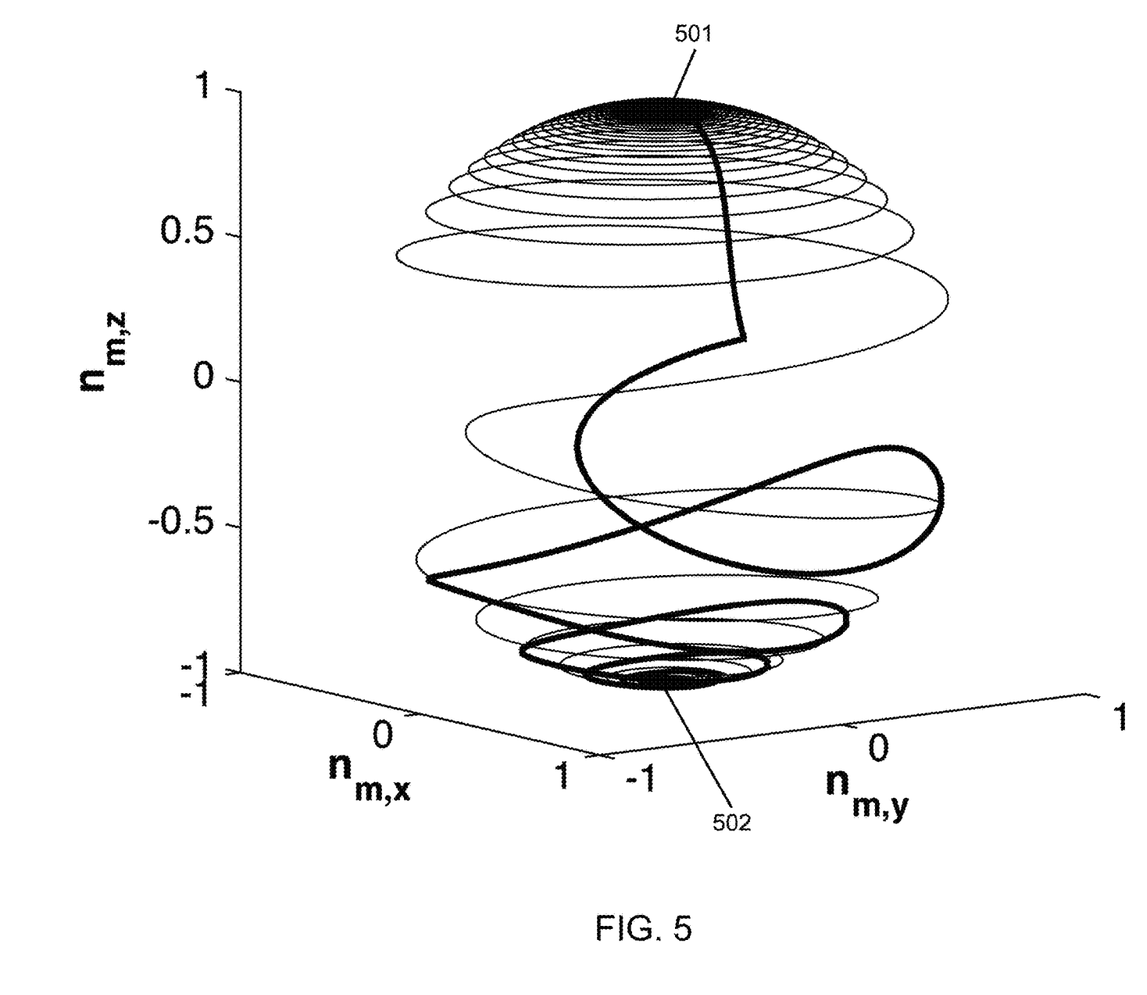
FIG. 5 is a drawing showing the trajectory of the magnetization switching of a ferromagnetic layer using spin-orbit torques in the absence of an external magnetic field.

FIG. 5 shows the trajectory of the magnetization switching of a ferromagnetic layer using spin-orbit torques in the absence of any external magnetic field. As shown in FIG. 5, by injecting charge current $J_e$ through the heavy-metal nonmagnetic nanostrip, produced spin torques derive M out of the equilibrium position (also called an equilibrium state) toward the in-plane of the nanomagnet. By turning the charge current $J_e$ off after $t_e$ seconds, spin torque reduces to zero and M is close to the x-y plane and away from the $e_z$ axis by an angle of $\vartheta$. At this zone, referred here to as the critical zone, $H_{eff}$ is significantly dominated by $H_{kx}$. Therefore, M passes the hard axis by precessing around the $H_{eff}$. By passing the hard axis, $H_{eff}$ is dominated by $H_{kz}$. Hence, M is pulled towards the new equilibrium state by precessing and damping around $H_{eff}$, completing the magnetization switching.

The duration $t_e$ of the applied current pulse is as short as the time which causes the magnetization M to move from the equilibrium state to the critical zone. The magnetization switching can be performed using current pulses of a duration of sub-50 ps. Therefore, the proposed scheme significantly improves the switching speed and/or reduces the energy consumption, resulting in ultra-high-speed spin-torque memory and logic systems which have significantly low energy consumption. Furthermore, as no extra metal is required for producing an external magnetic field, integration density is considerably enhanced.

Both switching energy and switching speed can be determined by the angle $\xi$. There is a tradeoff between switching energy and switching speed as can be set by the angle $\xi$.

Heavy-metals as used hereinabove include any suitable transition metals having a large atomic number, such as, for example, tungsten (W), Tungsten (W) in β-phase, tantalum (Ta), Aluminum (Al), Gold (Au), Bismuth (Bi), Hafnium (HD, Molybdenum (Mo), Niobium (Nb), Palladium (Pd), or Platinum (Pt). Also included are any suitable metal alloys, such as, for example, an alloy of copper (Cu) and Bi, or an alloy of Cu and iridium (Ir). Suitable copper alloys include Cu/Pb, Cu/Pt, and Cu/Au.

Figure 6:
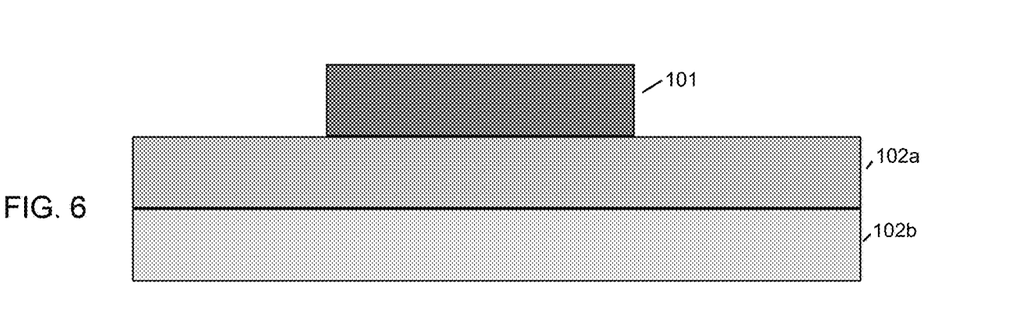
FIG. 6 is a drawings showing an exemplary base element for switching a magnetization state of a nanomagnet with a heavy-metal nanostrip bilayer.

FIG. 6 is a drawings showing an exemplary base element for switching a magnetization state of a nanomagnet with a heavy-metal nanostrip bilayer. Nanomagnet 101 is disposed adjacent to a surface of the heavy-metal nanostrip 102 as before. The bilayer heavy-metal nanostrip now includes two layers 102a and 102b. Each of the layers 102a, 102b can be made of a single element or of an alloy of elements.

Figure 7:
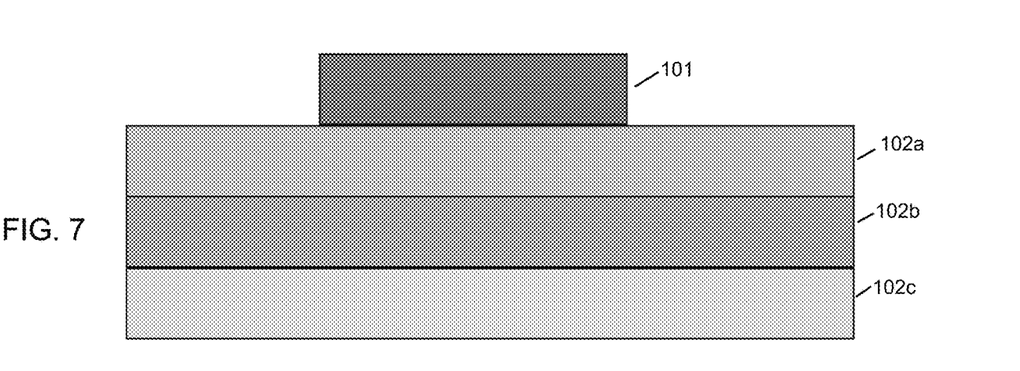
FIG. 7 is a drawings showing an exemplary base element for switching a magnetization state of a nanomagnet with a heavy-metal nanostrip trilayer.

FIG. 7 is a drawings showing an exemplary base element for switching a magnetization state of a nanomagnet with a heavy-metal nanostrip trilayer. Nanomagnet 101 is disposed adjacent to a surface of the heavy-metal nanostrip 102 as before. The trilayer heavy-metal nanostrip now includes three layers 102a, 102b, and 102c. Each of the layers 102a, 102b, 102c can be made of a single element or of an alloy of elements.

Suitable compositions for heavy metal strip layers of any number of layers (e.g. bilayer, trilayer, etc.), include of Pt/Ta, Pt/W, Pt/Hf, and W/Hf. Other suitable alloys for bilayers, include, for example, Au/W, Pt/Hf, Pt/Al, and Au/Ta. For example, there can be a bilayer of Pt 102a, and Ta 102b. Or, 102a could be made of an alloy including Pt/Ta, and 102b a different element or alloy.

Layers 102, 102a, 102b, 102c, etc. can typically have thickness dimensions on the order of about 1-100 nm. Any suitable shapes can be used in width and length dimension (or, radius), typically on the order of about 10 nm to 10 μm.

Figure 8:
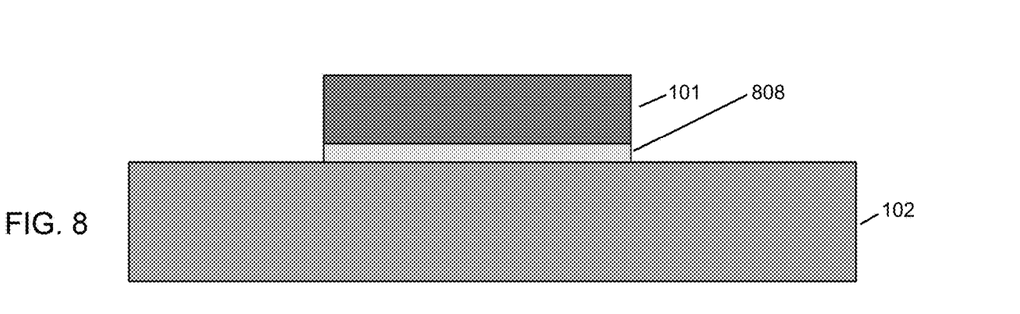
FIG. 8 is a drawing showing an optional interfacial layer disposed between the nanomagnet and the heavy metal strip.

FIG. 8 is a drawing showing an optional "spacer layer" as interfacial layer 808 disposed between the nanomagnet 101 and the heavy metal strip 102. For example, there can be a relatively thin layer Hf layer inserted between the heavy metal nonmagnetic layer and the nanomagnet to improve the interfacial properties. An interfacial layer typically has a thickness or height dimension on the order of about 0.1 nm to 10 nm. The spacer layer can help to improve switching efficiency by enhancing the interfacial properties and magnetic anisotropy. The spacer layer improves the transition between the spin polarization of the heavy magnet layer and spin interaction with the nanomagnet.

By injecting a charge current through a heavy-metal thin film of any suitable metal or metal alloy as listed hereinabove, a traverse spin current is produced due to strong spin-orbit coupling. As described hereinabove, the produced spin current may be used to switch the direction of the magnetization of a nanomagnet. By injecting a charge current through a heavy-metal thin film, a traverse spin current is produced due to strong spin-orbit coupling. The produced spin current may be used to switch the direction of the magnetization of a nanomagnet. The magnitude of the produced spin current is directly proportional to the spin Hall angle of a thin film heavy-metal. Large spin Hall angles have been observed in some high resistivity thin films of heavy-metals. It has been shown both experimentally and theoretically that the magnitude of the spin Hall angle in some thin film heavy-metals such as, for example, thin films of W is directly proportional to the resistivity (thickness) of the thin film. For example, it has been observed that by increasing the thickness of a thin film of tungsten from 5.2 nm to 15 nm, the spin Hall angle drops from 0.33 to less than 0.07.

The magnitude of the produced spin current is directly proportional to the spin Hall angle of a thin film heavy-metal. Large spin Hall angles have been observed in some high resistivity thin films of heavy-metals. It has been shown both experimentally and theoretically that the magnitude of the measured (calculated) spin Hall angle in thin film heavy-metals is directly proportional to the resistivity (thickness) of the thin film. For example, it has been observed that by increasing the thickness of a thin film of tungsten from 5.2 nm to 15 nm, the spin Hall angle drops from 0.33 to less than 0.07.

The spin Hall effect is also a function of material concentration, such as, for example, a heavy metal concentration (e.g. a Pt concentration) in combination with dopants, such as, for example, a boron dopant, oxygen dopants, or any other suitable materials The nanomagnet can be made from any suitable magnetic materials such as a metal alloy with dopants, a boron dopant, oxygen dopants, or any other suitable materials. Suitable examples of magnetic materials include any suitable ferromagnetic materials. For example, the nanomagnet can be made of Ruthenium (Ru), Ta, Co, Pt, Ni, TaN, $NiFeO_x$, NiFeB, CoFeB, CoFe, $CoFeO_xB$, NiOxB, $CoBO_x$, $FeBO_x$, CoFeNiB, CoPt, CoPd, CoNi, $TaO_x$, Fe, CoB, and any suitable mixture, combination, and/or alloys thereof. There can also be a nanomagnet which includes a multi-layer structure including combinations of any of the nanomagnet materials described hereinabove.

Fabrication and Manufacturing Techniques

Any suitable nm and μm fabriction techniques can be used.

For example, the fabrication process can start with a mask which can be formed above the layer stack. The mask can be formed of silicon oxide, silicon oxide nitride, silicon carbide nitride or silicon nitride. The mask can be a hard mask. Examplary suitable hard mask materials include TiN, TAN, TiTaN, and spin-on-carbon/spin-on-glass materials. A mask layer can be deposited above the layer stack. The mask portions can be defined, for example, by patterning a photo resist formed on the mask layer and transferring the pattern of the photo resist to the mask layer by etching.

The pattern of the mask can subsequently be transferred to the layer stack by etching regions of the layer stack which are exposed by the mask portions. The layer stack can be patterned using in an anisotropic etch process such as a reactive-ion-etching (RIE) process or an ion-beam-etching (IBE) process. The layer stack can be etched until the pattern has been completely transferred to the lower-most layer of the device pillars.

Films can be deposited using any suitable deposition technique, such as, for example, ion-beam deposition or DC magnetron sputtering techniques.

During manufacturing, a thermal annealing process is often performed right after the film layer deposition process to assist in crystallization of the ferromagnetic layers as well as any insulator material sandwiched in the device structure. Insufficient thermal energy or inaccurate temperature control during the annealing process can cause the film bonding structures or properties formed in an undesirable manner. For example, inaccurate temperature control or undesired drift of the thermal diffusion during the annealing process can result in insufficient crystallization of the film layer, leading to failure of the device to meet its intended performance.

Substrates, Device Layers

It is understood that the base elements described herein are typically disposed on any suitable substrate. Suitable substrates include, for example, semiconductor substrates. Semiconductor substrates include, for example, a Si substrate, a Ge substrate, a SiGe substrate, a SiC substrate, a Silicon on Insulator (SOI) substrate, a GeOI substrate, a SiGeOI substrate. Base elements can also be fabricated in device layers, such as, for example, between metallization layers of subsequent device layers, where there are two or more device layers typically disposed in layers above a substrate.

In summary with reference to the exemplary embodiment of FIG. 1, a base element 100 for switching a magnetization state of a nanomagnet 101 includes a heavy-metal strip 102 having a surface 103. The ferromagnetic nanomagnet 101 is disposed adjacent to the surface 103 of the heavy-metal strip 102. The ferromagnetic nanomagnet 101 has a first magnetization equilibrium state 501 and a second magnetization equilibrium state 502 (also referred to in some embodiments as an upward equilibrium state and a downward equilibrium state). The first magnetization equilibrium state 501 or the second magnetization equilibrium state 502 is settable by a flow of electrical charge having an electrical charge current direction 301 through the heavy-metal strip. The ferromagnetic nanomagnet can also be a feature of a magnetic layer in an integrated device incorporating the base element.

In some embodiments, by causing a flow of charge (current) in the heavy-metal strip as described hereinabove the magnetization of the nanomagnet can be switched between a first equilibrium state and a second equilibrium state, such as by reversing the direction of the flow of charge. In some applications, such as, for example where the structure is a base element of a memory or a logic system, the first equilibrium state can be assigned to either a Boolean "0" or a "1" and the second equilibrium state can be assigned to the other Boolean number different from the first equilibrium state. In such applications, the method to change the magnetization as described hereinabove is analogous to a "write" operation.

Also, in such applications, methods for reading the magnetization state of a base element are known, such as, for example, by adding an insulating layer over the nanomagnet and another magnetic layer having a fixed magnetization over the insulating layer. When the nanomagnet is switched to a magnetization equilibrium state about parallel to the magnetization of the fixed magnetization magnetic layer, there will be a low electrical resistance between the magnetic layer having a fixed magnetization and the magnetic layer having a switchable magnetization. Conversely, when the nanomagnet is switched to a magnetization equilibrium state about anti-parallel to the magnetization of the fixed magnetization magnetic layer, there will be a high electrical resistance between the magnetic layer having a fixed magnetization and the magnetic layer having a switchable magnetization. Thus, in some embodiments, a "read" operation to determine the magnetization state of the base element (e.g. a single "bit") can be performed by sensing a low resistance or a high resistance.

The base element described hereinabove can be used as a bit of an integrated device, such as, for example, a memory device or a logic device. For example, the base element as described hereinabove can provide a bit of an embedded memory, provide a bit in a computation in memory, and/or provide a bit in a logic in memory.

The base element can also provide a bit in an electronic sensor device. For example, the base element described hereinabove can be used as the sensing element of a temperature sensor as described in the co-pending Application, DISTRIBUTED SPINTRONIC/CMOS SENSOR NETWORK FOR THERMAL AWARE SYSTEMS, U.S. patent application Ser. No. 16/787,681 which application is incorporated herein by reference in its entirety for all purposes. Other suitable sensor applications include pressure sensing and magnetic field sensing.

In such applications, techniques of integration known in the art can be used to form and interconnect a plurality of such base elements. Billions of such base elements with nanomagnets of an integrated magnetic layer can be integrated into a single integrated device. Internal integrated electrical connections between base elements can be made using integrated circuit interconnection techniques known in the art.

Layers shown in the drawings can extend laterally and/or horizontally beyond the illustrated proportions. For simplicity and clarity, the various layers and other features of the stacks are not drawn to scale and are not intended to show relative dimensions, including thickness, can vary in fabricated physical stacks.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:

1. A base element for switching a magnetization state of a nanomagnet comprising:
   a heavy-metal nanostrip having a surface, said heavy-metal nanostrip comprising at least a first layer comprising a heavy metal and a second layer comprising a different heavy-metal;
   a ferromagnetic nanomagnet disposed adjacent to said surface, said ferromagnetic nanomagnet comprising a shape having a long axis and a short axis, said ferromagnetic nanomagnet having both a perpendicular-to-the-plane anisotropy $H_{kz}$ and an in-plane anisotropy $H_{kx}$ and said ferromagnetic nanomagnet having a first magnetization equilibrium state and a second magnetization equilibrium state, said first magnetization equilibrium state or said second magnetization equilibrium state settable by a flow of electrical charge through said heavy-metal nanostrip; and
   wherein a direction of said flow of electrical charge through said heavy-metal nanostrip comprises an angle $\xi$ with respect to said short axis of said nanomagnet, said flow of electrical charge non-perpendicular to said short axis.

2. The base element of claim 1, wherein said heavy-metal nanostrip comprises a trilayer.

3. The base element of claim 1, wherein said heavy-metal nanostrip comprises a Hafnium (Hf) or a Tungsten (W) in β-phase.

4. The base element of claim 1, wherein said heavy-metal nanostrip comprises at least one of a Cu/Pb alloy, a Cu/Pt alloy, and a Cu/Au alloy.

5. The base element of claim 1, wherein said heavy-metal nanostrip comprises a bilayer.

6. The base element of claim 5, wherein said bilayer comprises at least one of Pt/Ta, Pt/W, Pt/Hf, and W/Hf.

7. The base element of claim 5, wherein said bilayer comprises at least one of Au/W, Pt/Hf, Pt/Al, and Au/Ta.

8. The base element of claim 1, wherein said nanomagnet comprises a Co alloy.

9. The base element of claim 1, wherein said nanomagnet comprises at least one of Ruthenium (Ru), Ta, Co, Pt, Ni, TaN, NiFeO$_x$, NiFeB, CoFeB, CoFe, CoFeO$_x$B, NiOxB, CoBO$_x$, FeBO$_x$, CoFeNiB, CoPt, CoPd, CoNi, TaO$_x$, FeCoB, mixtures thereof, combinations thereof, and alloys thereof.

10. The base element of claim 1, wherein said nanomagnet comprises a multilayer structure.

11. A base element for switching a magnetization state of a nanomagnet comprising:
    a heavy-metal nanostrip having a surface;
    a ferromagnetic nanomagnet disposed adjacent to said surface, said ferromagnetic nanomagnet comprising a shape having a long axis and a short axis, said ferromagnetic nanomagnet having both a perpendicular-to-the-plane anisotropy $H_{kz}$ and an in-plane anisotropy $H_{kx}$ and said ferromagnetic nanomagnet having a first magnetization equilibrium state and a second magnetization equilibrium state, said first magnetization equilibrium state or said second magnetization equilibrium state settable by a flow of electrical charge through said heavy-metal nanostrip;
    a Hf layer disposed between said heavy-metal nanostrip and said ferromagnetic nanomagnet; and
    wherein a direction of flow of said flow of electrical charge through said heavy-metal nanostrip comprises an angle $\xi$ with respect to said short axis of said nanomagnet, said flow of electrical charge non-perpendicular to said short axis.

12. A base element of a sensor device for switching a magnetization state of a nanomagnet comprising:
    a heavy-metal strip having a surface;
    a ferromagnetic nanomagnet disposed adjacent to said surface, said ferromagnetic nanomagnet comprising a shape having a long axis and a short axis, said ferromagnetic nanomagnet having both a perpendicular-to-the-plane anisotropy $H_{kz}$ and an in-plane anisotropy $H_{kx}$ and said ferromagnetic nanomagnet having a first magnetization equilibrium state and a second magnetization equilibrium state, said first magnetization equilibrium state or said second magnetization equilibrium state settable in an absence of an external magnetic field by a flow of electrical charge through said heavy-metal strip;
    wherein a direction of flow of said flow of electrical charge through said heavy-metal strip comprises an angle $\xi$ with respect to said short axis of said nanomagnet; and
    wherein said base element provides a sensing element of said sensor device, said flow of electrical charge non-perpendicular to said short axis.

13. The base element of claim 12, wherein said sensor device comprises a temperature sensor.

14. The base element of claim 12, wherein said sensor device comprises a pressure sensor.

15. The base element of claim 12, wherein said sensor device comprises a magnetic field sensor.

* * * * *